United States Patent
Gaunt

(10) Patent No.: US 6,254,438 B1
(45) Date of Patent: Jul. 3, 2001

(54) BATTERY SIDE-TERMINAL ADAPTER AND KELVIN CONNECTOR

(75) Inventor: Bruce W. Gaunt, Round Lake Beach, IL (US)

(73) Assignee: Snap-on Tools Company, Kenosha, WI (US)

( * ) Notice: Subject to any disclaimer, the term of this patent is extended or adjusted under 35 U.S.C. 154(b) by 0 days.

(21) Appl. No.: 09/422,678

(22) Filed: Oct. 21, 1999

(51) Int. Cl.[7] ............................................. H01R 4/30
(52) U.S. Cl. ................................. 439/755; 439/759
(58) Field of Search .............................. 439/755, 759, 439/522, 175

(56) References Cited

U.S. PATENT DOCUMENTS

| | | |
|---|---|---|
| 1,651,294 | 11/1927 | Rumore . |
| 2,267,826 | 12/1941 | Heyer . |
| 3,745,516 | 7/1973 | Lieberman . |
| 4,377,317 | 3/1983 | Shekel et al. . |
| 4,505,032 | 3/1985 | Praria . |
| 4,975,089 * | 12/1990 | Lee ....................................... 439/755 |
| 5,082,456 * | 1/1992 | Lan ....................................... 439/504 |
| 5,234,359 | 8/1993 | Takahashi et al. . |
| 5,574,355 | 11/1996 | McShane et al. . |
| 5,592,093 | 1/1997 | Klingbiel . |
| 5,720,633 * | 2/1998 | Krivec .................................. 439/759 |
| 5,744,962 | 4/1998 | Alber et al. . |
| 5,753,920 | 5/1998 | Buehler et al. . |
| 5,757,192 | 5/1998 | McShane et al. . |
| 5,831,435 | 11/1998 | Troy . |
| 5,861,223 * | 1/1999 | Motlagh .............................. 429/121 |
| 5,862,515 | 1/1999 | Kobayashi et al. . |
| 5,886,530 | 3/1999 | Fasnacht et al. . |
| 5,901,002 | 5/1999 | Bonaccio . |

* cited by examiner

*Primary Examiner*—Tulsidas Patel
*Assistant Examiner*—Brian S. Webb
(74) *Attorney, Agent, or Firm*—Seyfarth Shaw

(57) ABSTRACT

A battery connector (20) is provided that can be especially useful as a side-terminal adapter for use with a Kelvin connection. In one form, the connector comprises an insulator (70) sandwiched between an elongated first conductor (30) having a longitudinal axis and an elongated second conductor (50), wherein the first conductor and second conductor are slidably movable relative to each other. The first and second conductors respectively include first and second battery-terminal contact portions (38, 58) which are opposite each other and slidable relative to each other. A biasing member (48) biases the battery-terminal contact portions toward each other and a handle (90) is provided to exert a pressure against the bias to move the battery-terminal contact portions apart.

18 Claims, 2 Drawing Sheets

BATTERY SIDE-TERMINAL ADAPTER AND KELVIN CONNECTOR

BACKGROUND OF THE INVENTION

The present invention relates to electrical connectors. The invention has particular application to battery terminal clamps, especially to clamp adapters for side-terminal batteries.

Various types of connectors have been used for electrically connecting to battery terminals. However, traditional battery clamps are often difficult to position on side-terminal batteries. Because of this, various side-terminal adapters have been designed to connect to this type of terminal and allow easier use of traditional battery clamps. Likewise, specialized side-terminal clamps have also been designed specifically for dealing with side-terminal batteries. Examples of battery terminal connectors and side-terminal adapters are shown in U.S. Pat. Nos. 1,651,294; 2,267,826; 3,745,516; 4,377,317; 4,565,414; 5,662,504 and 5,862,515.

The prior art side-terminal adapters and battery clamps were often designed with two pivoting toothed jaws biased closed to grip a terminal therebetween. The teeth used in this design often provide minimal electrical contact with the side terminals and could easily inadvertently fall off.

Some side-terminal adapters provided a metal plate with a slotted opening between two relatively stationary toothed jaws. With this type of device, the side-terminal bolts are wedged in the opening between the jaws. However, this design tends to fail because the jaws can bend away from one another, especially when the device is attached and removed during repeated use. This bending can cause the quality of both the physical and electrical connections to deteriorate. Furthermore, any attempt to engage too large a terminal with the side-terminal adapter can permanently deform this type of device and render it useless.

Various types of circuitry and connectors have been used to make Kelvin connections that are often used for battery testing equipment. The minimal electrical contacts of prior battery clamps and side-terminal adapters become even more of a problem when a Kelvin connection is needed to test a battery. A Kelvin connection is a four point connection technique that allows current to be injected into a battery through a first pair of connectors attached to the battery terminals, while a second pair of connectors is attached to the battery terminals in order to measure the voltage across the terminals. Often modified alligator-type clamps, with the jaws electrically isolated from each other, are used to make the connections. In that case, each electrical contact is even more tenuous because only a single jaw provides each connection. Examples of such circuitry and connectors are shown in U.S. Pat. Nos. 2,267,826; 4,505,032; 5,234,359; 5,574,355; 5,592,093; 5,744,962; 5,753,920; 5,757,192; 5,831,435; 5,862,515; 5,886,530; and 5,901,002.

Furthermore, testing a battery using a Kelvin connection to the prior-art side-terminal adapters, instead of directly to the terminals themselves, is less accurate. An increase in measurement error occurs because the terminal adapters provide additional resistance in the current path, thereby affecting the measurement.

Thus, these prior electrical connectors often provide tenuous mechanical and electrical connections to the battery. Likewise, battery tests are prone to inaccuracy when standard side-terminal adapters are used to make Kelvin connections.

SUMMARY OF THE INVENTION

It is a general object of the invention to provide an improved electrical connector which avoids the disadvantages of prior connectors, while affording additional structural and operating advantages that allow it to be easily used with a side-terminal battery.

A feature of the invention is the provision of an electrical connector that can be easily used on a side-terminal battery.

A different feature of the invention is the provision of a side-terminal adapter having electrical contacts that are non-pivotally movable to contact a battery terminal.

Another feature of the invention is the provision of side-terminal adapter that can be more accurately used with testing equipment to make a Kelvin connection to a side-terminal battery.

The invention consists of certain novel features and a combination of parts hereinafter fully described and illustrated in the accompanying drawings, it being understood that various changes in the details may be made without departing from the spirit, or sacrificing any of the advantages of the present inventions.

BRIEF DESCRIPTION OF THE DRAWINGS

For the purpose of facilitating an understanding of the inventions, there is illustrated in the accompanying drawings preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
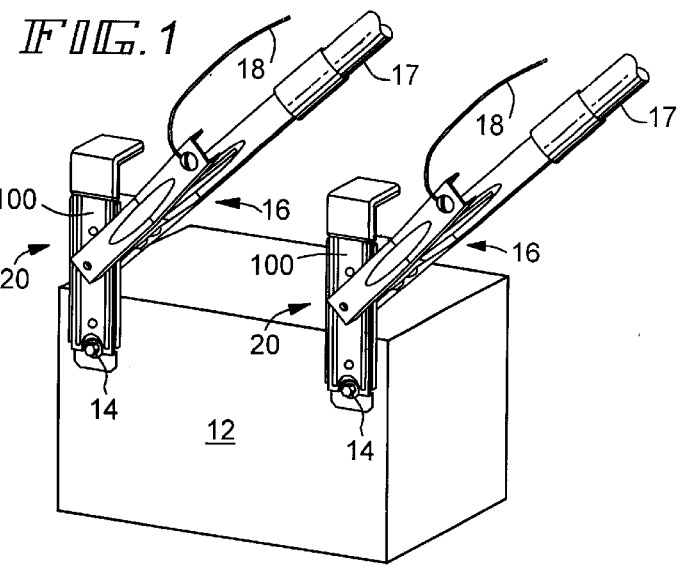
FIG. 1 is a perspective view of a battery connected to Kelvin connection, pivoting-jaw clamps via side-terminal adapters in accordance with the invention.

Referring to FIG. 1, there is illustrated a battery 12 having side mounted hex head terminals 14. Two side-terminal adapters 20, constructed in accordance with and embodying the features of the present invention, are respectively clamped to the terminals 14 to make Kelvin connection points at terminals 14, as discussed below. A pair of pivoting jaw-type battery clamps 16 are respectively clamped to the side-terminal adapters 20 and are designed to continue the circuit that includes the Kelvin connection. Therefore, while one jaw of each clamp is connected to an associated cable 17 in standard fashion, the other jaw is connected to a separate wire 18 and the two jaws are electrically isolated from each other, all in a known manner.

Referring to FIGS. 2–6, side-terminal adapter 20 preferably comprises an elongated, substantially flat, plate-like member, such as a conductor 30 having a longitudinal axis. In a preferred form, conductor 30 includes fastener openings 32 sized to accept fasteners 31. Grooves 34 are formed in one face of conductor 30 and deform it to form ribs (not shown) that extend out from the opposite face of conductor 30. The grooves 34 and ribs are preferably provided adjacent the longitudinal edges of conductor 30 for additional structural strength, thereby allowing less material to be used. A cutout 36 is preferably provided at one end of conductor 30 and defines a terminal contact 38 contoured to engage terminal 14. A flange, or lever 42, preferably extends out from the opposite end of conductor 30 at approximately a right angle and is surrounded by an electrically insulating grip 44. A seat 46 is preferably provided in the top face of grip 44 and is sized to accept compression spring 48.

Another elongated, substantially flat, plate-like member, such as conductor 50, is provided and also has a longitudinal axis. In a preferred form, conductor 50 is longer than conductor 30. In a preferred form, conductor 50 preferably includes fastener openings 52 sized to accept fasteners 31. Ribs 54 are preferably provided adjacent the longitudinal edge of conductor 50 for additional structural strength, thereby allowing less material to be used. In a preferred form, grooves (not shown) are formed on one face of conductor 50 and deform it to form ribs 54 on the opposite face. At one end of conductor 50, an offset portion 55 is preferably provided. A cutout 56 spans the offset portion 55 and the adjacent end of the main portion of the conductor 50. The cutout 56 defines a terminal contact 58 on the offset portion 55 contoured to engage terminal 14. A flange, or lever 62, preferably extends out from the opposite end of conductor 50 at approximately a right angle and is surrounded by electrically insulating grip 64. A seat (not shown) is preferably provided in the bottom face of grip 64 and sized to accept the compression spring 48.

An electrical insulator 70 is preferably provided and comprises an elongated, substantially flat, plate-like structure. Insulator 70 preferably includes fastener openings 72 sized to accept fastener 31. A cutout 76 is provided at one end of insulator 70 and is preferably contoured to approximately align with at least a portion of cutout 36 (or 56). In a preferred form insulator 70 is slightly wider than conductors 30 and 50 and flanges 77 are provided along the longitudinal edges of insulator 70.

In the preferred embodiment, conductors 30 and 50 are longitudinally slidably coupled together with insulator 70 sandwiched between them. A non-conductive fastener 31 can be used to fasten conductors 30 and 50 and insulator 70 together through fastener openings 32, 52 and 72. At least one of fastener openings 32 and 52 are elongated to allow fastener 31 to slide within that elongated fastener opening, thereby allowing conductors 30 and 50 to slide relative to each other in a longitudinal direction (see FIGS. 2–4). Although openings 32 and 52 could both be elongated, it is preferred that only the openings 32 or the openings 52 be elongated in order to allow insulator 70 to remain fixed to one of conductors 30 and 50.

In order to allow conductors 30 and 50 to make a Kelvin connection point at terminal 14, insulator 70 electrically isolates conductors 30 and 50 from each other. Therefore, fastener openings 72 are preferably just large enough to accommodate fastener 31 in order to minimize the chances of arcing across insulator 70 through fastener openings 72. A small fastener opening 72 also allows insulator 70 to be fixed to one of conductors 30 and 50 so that one conductor always remains completely covered while the conductors are sliding back and forth.

In a preferred form insulator 70 is slightly wider than conductors 30 and 50 and flanges 77 are provided along the longitudinal edges of insulator 70 to provide additional protection against arcing between the longitudinal edges of the conductors 30 and 50. Flanges 77 also define a guide for the sliding movement of conductors 30 and 50. It is also preferred that cutout 76 be contoured to and approximately align with one of cutouts 36 and 56 so that the insulator 70 does not interfere with making an electrical connection.

After conductors 30 and 50 are coupled together, terminal contacts 38 and 58 facing each other and cooperate to define the terminal connector 80 that clamps the battery terminal 14 therebetween. As conductors 30 and 50 slide back and forth, terminal contacts 38 and 58 move toward and away from each other.

When terminal contact 38 engages terminal 14, one of the electrical connections necessary for the Kelvin connection is made. When terminal contacts 38 and 58 engage terminal 14, two of the electrical connections necessary for the Kelvin connection are made. The second side-terminal adapter 20 makes the other two connections to the second terminal 14 of the battery for completing the Kelvin connection.

When conductors 30 and 50 are coupled together, levers 42 and 62 cooperate to define handle 90 at the end opposite terminal connector 80. One end of compression spring 48 is inserted in seat 46 on the top face of grip 44 while the other end is inserted in the seat (not shown) in the bottom face of grip 64. In the preferred form, spring 48 biases terminal connector 80 toward a closed rest position (shown in FIG. 3) or a clamped position (shown in FIGS. 1 and 4). When side-terminal adapter 20 is coupled to a terminal 14 of a side-terminal battery 12, the portions of conductors 30 and 50 disposed above the top of battery 12 define two clamp-connecting portions 100 that are each engageable with a jaw of a jaw-type clamp (see FIG. 1).

Figure 2:
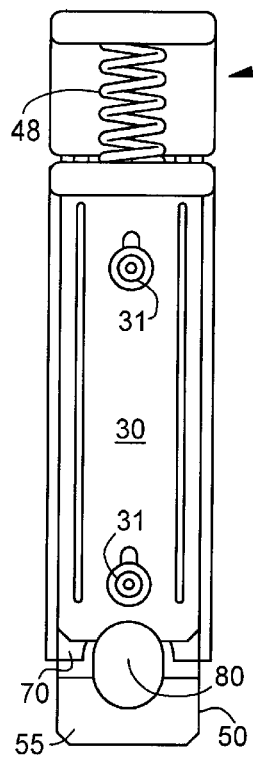
FIG. 2 is an enlarged, rear plan view of one of the side-terminal adapters of FIG. 1 in an open or mounting/demounting position.

The side-terminal adapter 20 is preferably operated by squeezing together levers 42 and 62 of handle 90 to overcome the biasing force of spring 48 and move terminal connector 80 to an open, or mounting/demounting position (shown in FIG. 2). When 9 handle 90 is released, terminal connector 80 closes. Handle 90 enables side-terminal adapter 20 to be easily coupled to a battery terminal 14 by squeezing and releasing handle 90 to open and close terminal connector 80.

Figure 3:
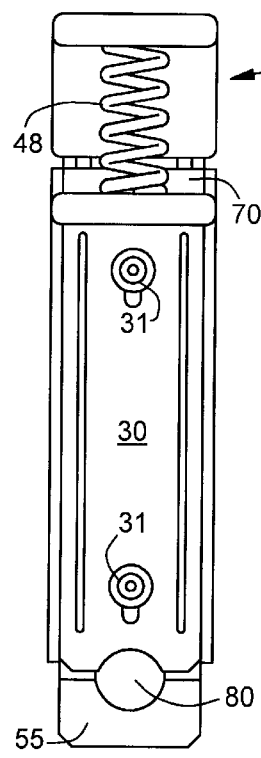
FIG. 3 is the side-terminal adapter of FIG. 2 in its normal rest position.
Figure 4:
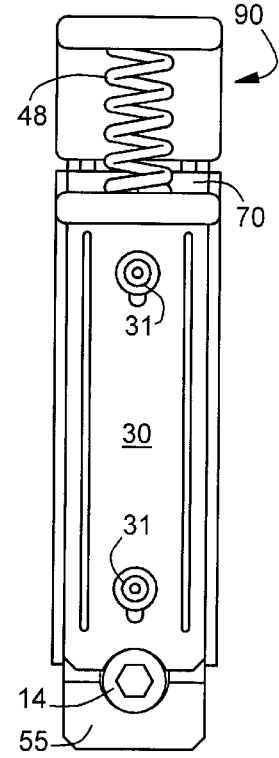
FIG. 4 is the side-terminal adapter of FIG. 2 in a clamped position engaging a battery side-terminal.
Figure 5:
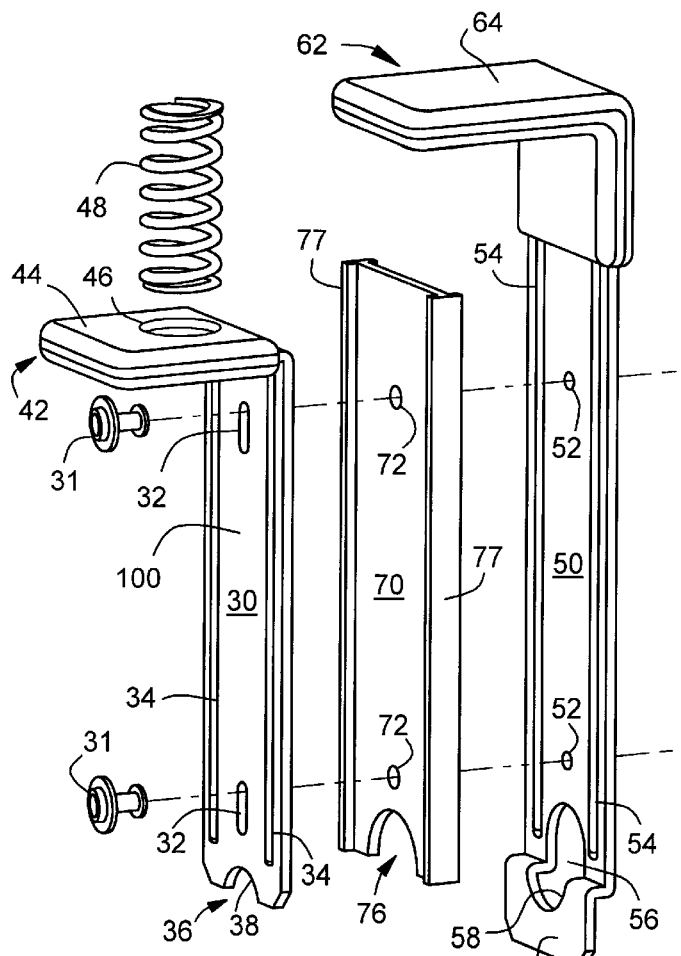
FIG. 5 is a further enlarged, exploded perspective view of the side-terminal adapter of FIG. 3.
Figure 6:
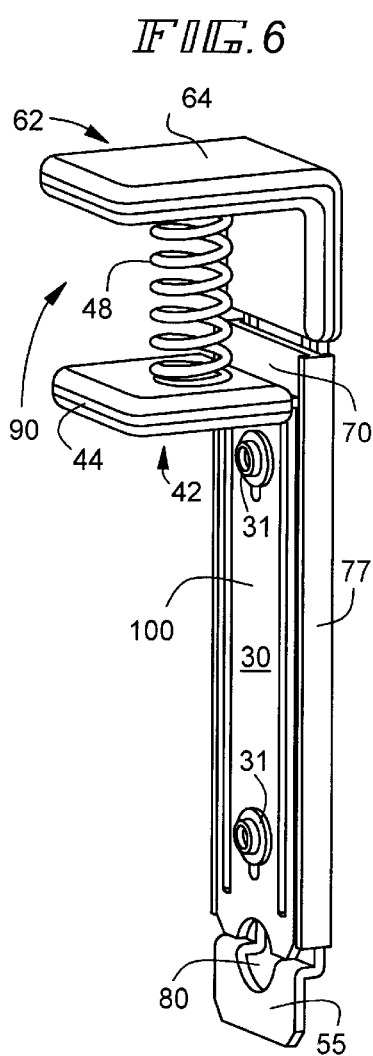
FIG. 6 is a further enlarged perspective view of the side-terminal adapter of FIG. 3.

Preferably, the length and position of elongated openings 32 (or 52) is such that when terminal connector 80 is in its rest position of FIG. 3, it remains partially open, but with the remaining opening being smaller than terminal 14. This allows a less obtrusive handle 90 to fit within a tight engine compartment because the handle need move only a small distance. It also reduces the compression of spring 48 required to apply terminal connector 80 to the battery terminal 14 in a clamped position and therefore reduces the spring force on the battery terminal, which could cause it to shear or deform. This is important because the terminal connector 80 can be clamped to a deformable substance, such as a lead battery terminal on a warm day.

When side-terminal adapter 20 is assembled, ribs 54 on conductors 30 and/or 50 preferably face the other conductor to define a reduced area of contact with insulator 70. This reduced area of contact is a friction-reducing structure that reduces the amount of friction caused by moving conductors 30 and 50 relative to each other and allows a weaker spring 48 to overcome the smaller frictional force.

In the preferred form, conductor 50 includes offset portion 55 that approximately aligns terminal contact 58 with terminal contact 38 in one plane in the assembled condition of the adaptor 20. By aligning terminal contacts 38 and 58 of the clamp, the compressive forces on the battery terminal 14 are also aligned. This alignment prevents two offset forces from shearing through terminal 14 or from causing side-terminal adapter 20 to tilt on terminal 14. Offset portion 55 also acts as a stop that prevents terminal connector 80 from fully closing when it is in a rest position.

It will be appreciated that there are many variations and other uses for the side-terminal adapters 20. For example, each conductor 30 and 50 could be attached directly to cable 17 or wire 18 or to different cables/wires that continue the circuit including the Kelvin connection, thereby eliminating the need for clamps 16. Likewise, side-terminal adapter 20 could be used as the clamp on a pair of jumper cables or the like. Insulator 70 could be omitted and the side-terminal adapters 20 could then be used as side-terminal adapters for standard jumper cables. Additionally, side-terminal adapter 20 could be modified to include a terminal connector 80 on each end in order to connect multiple batteries together. Likewise, the side-terminal adapter 20 could be used without modification on batteries having top post terminals.

Although terminal connector 80 is shown with a smooth contour, a plurality of teeth or prongs can be used instead to engage with the battery terminal 14 and provide an electrical connection. Although terminal contacts 38 and 58 define an opening even when the terminal connector 80 is in its rest condition, the connector could be altered so terminal contacts slide past each other so no opening exists when the terminal clamping portion is in a closed or rest position. Although plate-like conductors 30, 50 are depicted, they can be curved, cylindrical, or other suitable shape. However, because of the compactness of many engine compartments, a relatively flat conductor is preferred. Also, non-conductive members may be substituted for conductors 30 and 50 and an electrically conductive path, such as a cable, could be coupled to conductive terminal connector 80. Although it is preferable that conductors 30 and 50 slide longitudinally with respect to each other, they could be made to slide at an angle to the longitudinal direction. While the slidable connection shown involves a fastener that moves in an elongated opening, a different sliding connection could be substituted. Also, ribs 54 that decrease the force of friction could be provided on the faces of the insulator 70. Likewise, raised dots or other shapes can be substituted for ribs 54 to further decrease the surface areas in contact and further reduce friction. It can also be advantageous to make the insulator of a low-friction material, such as PTFE of the type sold under the trademark Teflon.

While particular embodiments of the present invention have been shown and described, it will be appreciated by those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A battery terminal connector comprising:

(a) an elongated first member having a longitudinal axis;

(b) an electrically conductive first contact portion coupled to the first member proximate a first end of the first member;

(c) a second member coupled to the first member for non-pivotal movement with respect thereto;

(d) an electrically conductive second contact portion opposing the first contact portion and coupled to the second member, the second contact portion being non-pivotally movable toward and away from the first contact portion with the second member;

(e) the first and second contact portions cooperating to define an electrically-conductive terminal connector;

(f) a biasing member coupled to the first and second members and biasing the first and second contact portions toward each other, and (g) an insulator electrically isolating the first contact portion from the second contact portion.

2. The battery terminal connector of claim 1, further comprising an electrically-conductive first clamp-connecting portion electrically coupled to at least one contact portion and engageable by a first jaw-type clamp jaw and disposed above a top of an associated battery when at least one contact portion is connected to a side terminal of the battery.

3. The battery terminal connector of claim 2, wherein the first clamp-connecting portion is electrically coupled to the first contact portion and the battery connector further comprises an electrically-conductive second clamp-connecting portion electrically coupled to the second contact portion and engageable with a second jaw-type clamp jaw, the insulator electrically isolating the first contact portion and the first clamp-connecting portion from the second contact portion and the second clamp-connecting portion.

4. The battery terminal connector of claim 1, wherein the first member is a first electrically-conductive plate electrically coupled to the first contact portion and the second member is an elongated second electrically-conductive plate electrically coupled to the second contact portion.

5. The battery terminal connector of claim 4, wherein the first contact portion and the second contact portion are disposed substantially in a common plane.

6. The battery terminal connector of claim 4, further comprising a friction-reducing structure between the first member and the second member.

7. The battery terminal connector of claim 6, wherein the friction-reducing structure includes a raised portion of at least one of the first member and the second member.

8. The battery terminal connector of claim 4, wherein the insulator includes an elongated insulating panel coupled between the first member and the second member, the insulating panel having a longitudinal edge and an insulating sidewall coupled thereto.

9. The battery terminal connector of claim 1, wherein the second member is coupled to the first member for movement longitudinally thereof.

10. The battery terminal connector of claim 1, further comprising a handle coupled to the biasing member and structured to permit manual application of a force that moves the first and second contact portions away from each other, wherein the handle is located above a top of an associated battery when the terminal connector is connected to a side terminal.

11. A side-terminal adapter for use with a Kelvin connector, the side-terminal adapter comprising:

(a) an elongated first member having a longitudinal axis;

(b) an electrically-conductive side-terminal connector coupled at a first end of the first member, the side-terminal connector comprising an electrically-conductive first contact and an electrically-conductive second contact opposite the first contact;

(c) an electrically-conductive first clamp-connecting portion electrically coupled to the first contact and engageable by a first jaw-type clamp jaw and disposed above a top of an associated battery when the first contact engages a side terminal of the battery;

(d) an electrically-conductive second clamp-connecting portion electrically coupled to the second contact and engageable by a second jaw-type clamp jaw and disposed above the top of the associated battery when the second contact engages the side terminal of the battery; and (e) an insulator electrically isolating the first clamp-connecting portion and the first contact from the second clamp-connecting portion and the second contact.

12. The side-terminal adapter of claim 11, wherein the first and second contacts are non-pivotally movable toward and away from each other.

13. The side-terminal adapter of claim 12, wherein the first contact and the second contact are disposed in a common plane.

14. The side-terminal adapter of claim 12, further comprising a second member coupled to the first member for movement longitudinally thereof, wherein the second terminal contact is coupled to the second member and movable toward and away from the first contact portion with the second member.

15. The side-terminal adapter of claim 14, further comprising a friction reducing structure defined by a raised portion of one of the first member, the second member and the insulator.

16. The side-terminal adapter of claim 14, wherein the insulator is coupled between the first member and the second member, the insulator including a longitudinal edge and a sidewall coupled thereto.

17. A battery terminal connector comprising:

(a) a conductor;

(b) a first electrically conductive contact coupled to the conductor and engageable with a first battery-terminal surface;

(c) a member coupled to the conductor for non-pivotal movement with respect thereto;

(d) a second electrically conductive contact coupled to the member and engageable with a second battery-terminal surface, wherein the second contact is movable toward and away from the first contact with the member;

(e) wherein at least one of the first and second contacts is electrically coupled to the conductor;

(f) a spring coupled to the conductor and the member and biasing the second contact in a first direction;

(g) a handle, coupled to the spring and structured to permit manual application of a force to move the second contact in a second direction opposite the first direction; and (h) an insulator structured to electrically isolate the first contact from the second contact.

18. The battery connector of claim 17, wherein the first and second contacts are engageable with the first and second battery-terminal surfaces located on a single terminal.

* * * * *